(12) United States Patent
Kim et al.

(10) Patent No.: US 7,391,634 B2
(45) Date of Patent: Jun. 24, 2008

(54) SEMICONDUCTOR MEMORY DEVICES HAVING CONTROLLABLE INPUT/OUTPUT BIT ARCHITECTURES

(75) Inventors: Sung-Hoon Kim, Gyeonggi-do (KR); Seong-Jin Jang, Gyeonggi-do (KR); Su-Jin Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/358,798

(22) Filed: Feb. 21, 2006

(65) Prior Publication Data

US 2006/0224814 A1 Oct. 5, 2006

(30) Foreign Application Priority Data

Feb. 28, 2005 (KR) .................. 10-2005-0016384

(51) Int. Cl.
*G11C 5/02* (2006.01)
*G11C 5/06* (2006.01)

(52) U.S. Cl. ............................. 365/51; 365/63
(58) Field of Classification Search ............ 365/51
See application file for complete search history.

(56) References Cited

U.S. PATENT DOCUMENTS

| | | | | |
|---|---|---|---|---|
| 3,810,301 A | * | 5/1974 | Cook ..................... | 438/6 |
| 4,482,984 A | * | 11/1984 | Oritani .................. | 365/154 |
| 4,635,233 A | * | 1/1987 | Matsumoto et al. ..... | 365/230.03 |
| 4,855,957 A | * | 8/1989 | Nogami ................. | 365/230.03 |
| 5,568,647 A | * | 10/1996 | Kobayashi ............. | 710/3 |
| 6,573,567 B1 | * | 6/2003 | Nishizawa et al. ..... | 257/358 |
| 6,594,818 B2 | * | 7/2003 | Kim et al. ............. | 716/19 |
| 6,621,755 B2 | * | 9/2003 | Gans et al. ............ | 365/230.03 |
| 6,628,538 B2 | * | 9/2003 | Funaba et al. ......... | 365/63 |
| 6,737,743 B2 | * | 5/2004 | Urakawa .............. | 257/724 |
| 6,885,092 B1 | * | 4/2005 | Sakuma et al. ........ | 257/686 |
| 6,972,487 B2 | * | 12/2005 | Kato et al. ............ | 257/723 |

(Continued)

FOREIGN PATENT DOCUMENTS

JP 2001-036016 2/2001

(Continued)

OTHER PUBLICATIONS

Notice to Submit Response in Korean Application No. 10-2005-0016384; Date of mailing Aug. 29, 2006.

(Continued)

*Primary Examiner*—Son L Mai
(74) *Attorney, Agent, or Firm*—Myers Bigel Sibley & Sajovec

(57) ABSTRACT

A semiconductor memory device may include a semiconductor substrate, a first unit memory device on the substrate, and a second unit memory device on the substrate. The first unit memory device may be configured to receive first through $N^{th}$ data bits and/or to provide first through $N^{th}$ data bits to an external device in response to a command signal, an address signal, and a clock signal, and in response to a first chip selection signal. The second unit memory device may be configured to receive $(N+1)^{th}$ through $2N^{th}$ data bits and/or to provide $(N+1)^{th}$ through $2N^{th}$ data bits to an external device in response to the command signal, the address signal, and the clock signal, and in response to a second chip selection signal. Related methods are also discussed.

22 Claims, 11 Drawing Sheets

U.S. PATENT DOCUMENTS

2004/0196699 A1* 10/2004 Vogelsang .............. 365/189.05
2006/0285419 A1* 12/2006 Hung et al. ............ 365/230.03

FOREIGN PATENT DOCUMENTS

| | | |
|---|---|---|
| JP | 2001-339031 | 12/2001 |
| JP | 2002-217366 | 8/2002 |
| KR | 2000-21372 A | 4/2000 |
| KR | 10-0422469 | 3/2004 |

OTHER PUBLICATIONS

English translation of Notice to Submit Response in Korean Application No. 10-2005-0016384; Date of mailing Aug. 29, 2006.

* cited by examiner

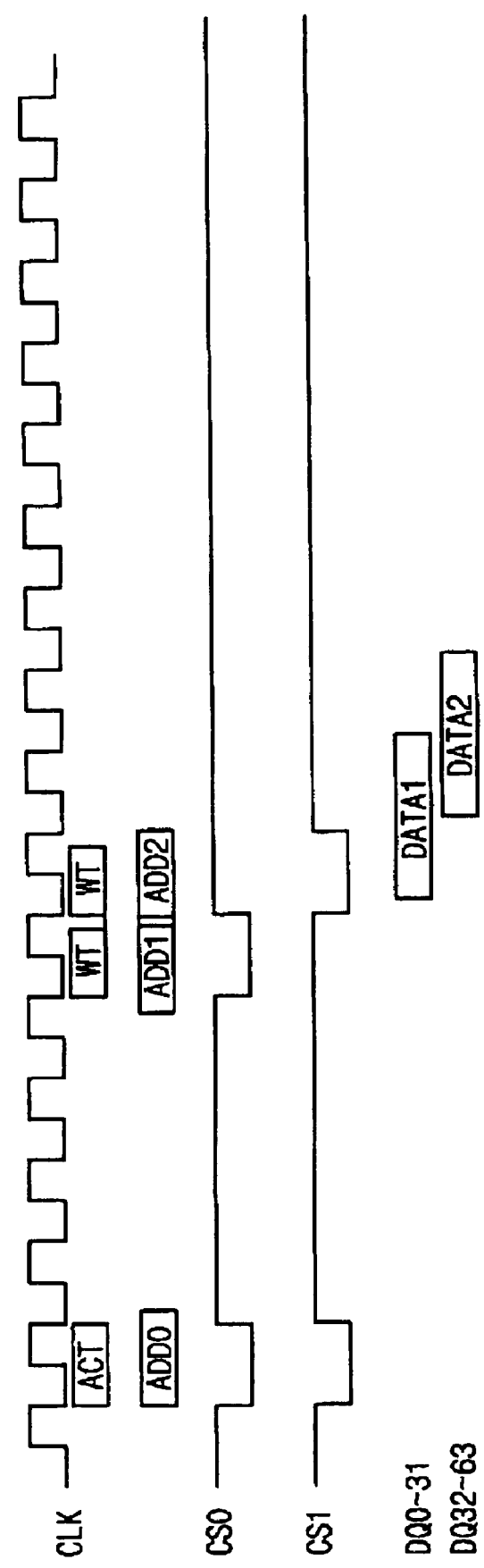

SCRIBE
LINE 36

SCRIBE
LINE 46

SEMICONDUCTOR MEMORY DEVICES HAVING CONTROLLABLE INPUT/OUTPUT BIT ARCHITECTURES

RELATED APPLICATION

This application claims the benefit of priority from Korean Patent Application No. 2005-16384 filed on Feb. 28, 2005 in the Korean Intellectual Property Office, the disclosure of which is hereby incorporated herein in its entirety by reference.

FIELD OF THE INVENTION

The present invention relates to semiconductor memory devices, and more particularly, to input/output architectures for memory devices and related devices and methods.

BACKGROUND

As data communication technologies have developed, rapid graphics processing capabilities have become more important for electronic products. For efficiency of a memory device, only a relatively small amount of data requiring high-speed processing is stored in a graphics memory, and most of the data is stored in a main memory. One high-speed data processing technique is to increase I/O bandwidth.

Recently, multi-chip package (MCP) technologies have been used to achieve high storage densities. For example, an MCP technology may implement a memory device having a 64-bit architecture using two memory chips having a 32-bit architecture.

Conventionally, two individual unit memory chips may be mounted on one package frame, and pads where an identical signal is provided to the two individual unit memory chips from an external device may be wire-bonded to each other.

Korean Patent No. 10-0422469 discloses a memory device capable of controlling storage density by packaging two or more non-separate unit memory chips formed on a wafer as a group. The memory device disclosed in Korean Patent No. 10-0422469 does not cut a scribe line between the unit memory chips but uses the scribe line as a connection path between the unit memory chips. The disclosure of Korean Patent No. 10-0422469 is hereby incorporated herein in its entirety by reference.

SUMMARY

According to some embodiments of the present invention, a semiconductor memory device may include a semiconductor substrate, and a first unit memory device and a second unit memory device on the semiconductor substrate. The first unit memory device may receive first through $N^{th}$ data bits and/or provide first through $N^{th}$ data bits to an external device in response to a command signal, an address signal, and a clock signal, and in response to a first chip selection signal. The second unit memory device may receive $(N+1)^{th}$ through $2N^{th}$ data bits and/or provide $(N+1)^{th}$ through $2N^{th}$ data bits to an external device in response to the command signal, the address signal, and the clock signal, and in response to a second chip selection signal.

According to some other embodiments of the present invention, a method of forming a semiconductor memory device may include forming a plurality of unit memory devices on a semiconductor wafer wherein each of the unit memory devices includes a respective command signal pad, a respective address signal pad, and a respective clock signal pad. A command signal line may be formed to electrically couple a first command signal pad and a second command signal pad of a respective first and a second unit memory device of the plurality of memory devices. An address signal line may be formed to electrically couplie a first address signal pad and a second address signal pad of the respective first unit memory device and the second unit memory device. A clock signal line may be formed to electrically couple a first clock signal pad and a second clock signal pad of the respective first unit memory device and the second unit memory device. The semiconductor wafer may be cut to separate at least a third unit memory device of the plurality of unit memory devices from the first unit memory device and the second unit memory device while maintaining the first unit memory device and the second unit memory device on a same semiconductor substrate cut from the semiconductor wafer.

According to embodiments of the present invention, a semiconductor memory device may have a controllable input/output bit architecture and/or have coupling pads in two more unit memory chips to each other without wire bonding.

According to some embodiments of the present invention, a semiconductor memory device may include a first unit memory chip configured to receive first through $N^{th}$ data at the semiconductor memory device or to provide first through $N^{th}$ data to an external device in response to a first chip selection signal, a command signal, an address signal and a clock signal. A second unit memory chip may commonly use a semiconductor substrate together with the first unit memory chip, and may receive $(N+1)^{th}$ through $2N^{th}$ data at the semiconductor memory device or to provide $(N+1)^{th}$ through $2N^{th}$ data to the external device in response to a second chip selection signal, the command signal, the address signal and the clock signal.

The first unit memory chip and the second unit memory chip may have a same configuration. The semiconductor memory device may provide a 2N-bit architecture when both the first chip selection signal and the second chip selection signal are enabled, and the semiconductor memory device may provide an N-bit architecture when only one of the first chip selection signal and the second chip selection signal is enabled. Moreover, first bonding pads, in the first unit memory chip, for the command signal, the address signal and the clock signal may be coupled to second bonding pads, in the second unit memory chip, for the command signal, the address signal and the clock signal through metal lines formed using a semiconductor manufacturing process. In addition, each of the metal lines of the first unit memory chip and the second unit memory chip may include a fuse circuit.

According to other embodiments of the present invention, a semiconductor memory device may include a first unit memory chip which receives first through $N^{th}$ data at the semiconductor memory device or which provides first through $N^{th}$ data to an external device in response to a first chip selection signal, a command signal, an address signal and a clock signal. A second unit memory chip may receive $(N+1)^{th}$ through $2N^{th}$ data at the semiconductor memory device or may provide the $(N+1)^{th}$ data through the $2N^{th}$ data to the external device in response to a second chip selection signal, the command signal, the address signal and the clock signal. A third unit memory chip may receive $(2N+1)^{th}$ through $3N^{th}$ data at the semiconductor memory device or may provide $(2N+1)^{th}$ through $3N^{th}$ data to the external device in response to a third chip selection signal, the command signal, the address signal and the clock signal. A fourth unit memory chip may receive $(3N+1)^{th}$ through $4N^{th}$ data at the semiconductor memory device or may provide $(3N+1)^{th}$ through $4N^{th}$ data to the external device in response to a fourth chip selection signal, the command signal, the address signal and the clock signal. Moreover, the first, second, third and fourth unit memory chips may be provided on one semiconductor substrate.

The first, second, third and fourth unit memory chips may have a same configuration. The semiconductor memory device may provide a 4N-bit architecture when all of the first, second, third, and fourth chip selection signals are enabled. The semiconductor memory device may provide a 3N-bit architecture when only three of the first, second, third and fourth chip selection signals are enabled. The semiconductor memory device may provide a 2N-bit architecture when only two of the first, second, third, and fourth chip selection signals are enabled. The semiconductor memory device may provide an N-bit architecture when only one of the first, second, third and fourth chip selection signals is enabled.

Scribe lines between the first unit memory chip and the second unit memory chip, between the third unit memory chip and the fourth unit memory chip, between the first unit memory chip and the third unit memory chip, and between the second unit memory chip and the fourth unit memory chip may be maintained uncut after a package step.

BRIEF DESCRIPTION OF THE DRAWINGS

The above and other features and advantages of the present invention will become more apparent when described in embodiments thereof with reference to the attached drawings in which:

FIGS. 2A and 2B are timing diagrams illustrating operations of semiconductor memory devices shown in FIG. 1.

DETAILED DESCRIPTION

Figure 1:
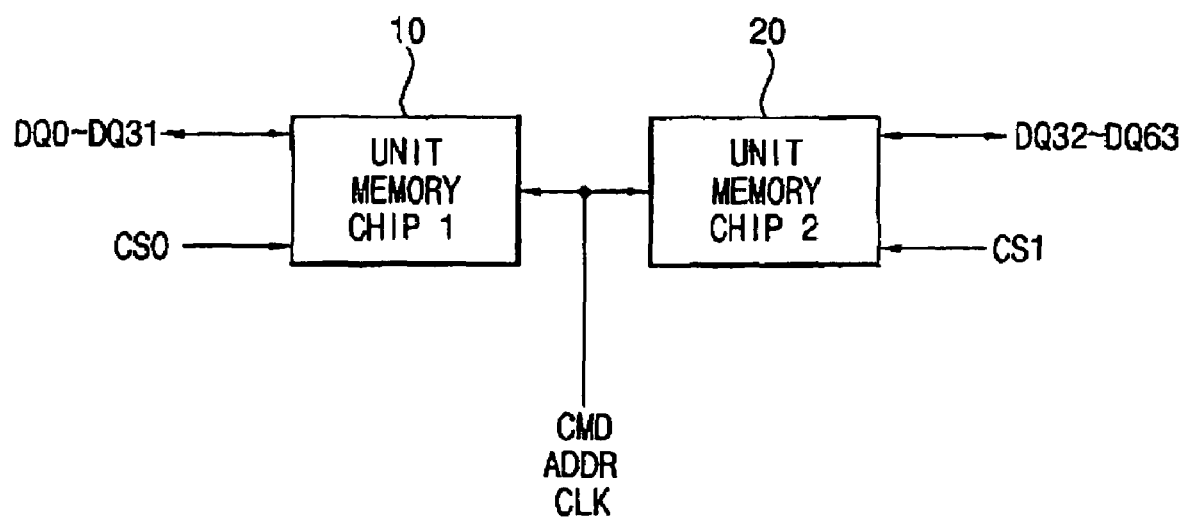
FIG. 1 is a block diagram illustrating a semiconductor memory device according to first embodiments of the present invention.

The present invention now will be described more fully hereinafter with reference to the accompanying drawings, in which illustrative embodiments of the invention are shown. However, this invention may be embodied in many different forms and should not be construed as limited to the embodiments set forth herein. Rather, these embodiments are provided so that this disclosure will be thorough and complete, and will fully convey the scope of the invention to those skilled in the art. Common reference numerals have been used, where possible, to designate elements that are common to different figures.

It will be understood that when an element is referred to as being "coupled", "connected" or "responsive" to another element, it can be directly coupled, connected or responsive to the other element or intervening elements may also be present. In contrast, when an element is referred to as being "directly coupled", "directly connected" or "directly responsive" to another element, there are no intervening elements present. As used herein the term "and/or" includes any and all combinations of one or more of the associated listed items and may be abbreviated by "/". Moreover, each embodiment described and illustrated herein includes its complementary conductivity type embodiment as well.

It will also be understood that, although the terms first, second, etc. may be used herein to describe various elements, these elements should not be limited by these terms. These terms are only used to distinguish one element from another element.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a block diagram illustrating a semiconductor memory device according to first embodiments of the present invention including two unit memory chips 10 and 20 of a 32-bit input/output architecture. Referring to FIG. 1, the semiconductor memory device includes a first unit memory chip 10 and a second unit memory chip 20.

The first unit memory chip 10 receives data DQ0 through DQ31 at the semiconductor memory device as data input and/or provides the data DQ0 through DQ31 to an external device as data output in response to a first chip selection signal CS0, a command signal CMD, an address signal ADDR and a clock signal CLK. The second unit memory chip 20 receives data DQ32 through DQ63 at the semiconductor memory device as data input and/or provides the data DQ32 through DQ63 to an external device as data output in response to a second chip selection signal CS1, the command signal CMD, the address signal ADDR and the clock signal CLK. A scribe line is disposed between the first unit memory chip 10 and the second unit memory chip 20, and is not cut at a package step.

Figure 2A:
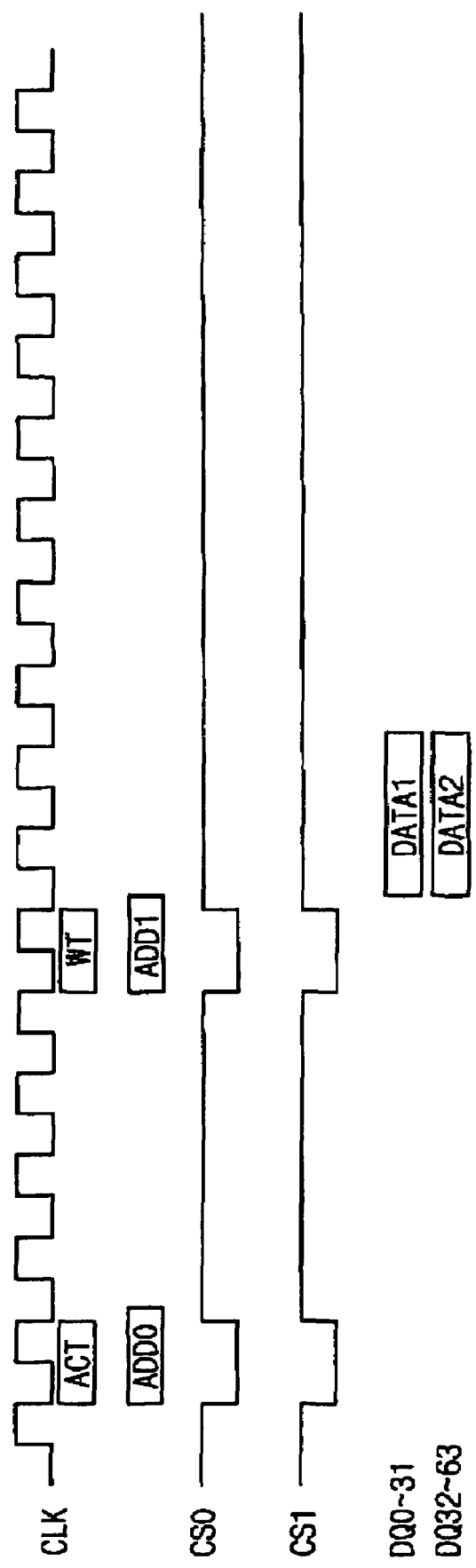

FIGS. 2A and 2B are timing diagrams illustrating operations of the semiconductor memory device shown in FIG. 1. Hereinafter, operations of the semiconductor memory device according to first embodiments of the present invention will be described with reference to FIGS. 1, 2A and 2B.

The semiconductor memory device shown in FIG. 1 is a memory device having a 64-bit input/output architecture implemented using two unit memory chips 10 and 20 each of which has a 32-bit input/output architecture. The first unit memory chip 10 and the second unit memory chip 20 may commonly use the same command signal CMD, the same address signal ADDR and the same clock signal CLK. The command signal CMD, the address signal ADDR, the clock signal, and the input/output data may be provided through input/output pads (not shown). The semiconductor memory device shown in FIG. 1 has an input/output architecture that may be varied based on each of the logic states of the chip selection signals CS0 and CS1.

For example, when both of the chip selection signals CS0 and CS1 are at a logic 'low' state, both of the unit memory chips 10 and 20 may be activated (or enabled) and 64-bits of data DQ0 through DQ63 may be received at the semiconductor memory device or provided to the external device. That is, when both of the chip selection signals CS0 and CS1 are at the logic 'low' state, the semiconductor memory device shown in FIG. 1 may provide a 64-bit input/output architecture.

When the first chip selection signal CS0 is at the logic 'low' state and the second chip selection signal CS1 is at a logic 'high' state, the first unit memory chip 10 is activated (or enabled) and the second unit memory chip 20 is deactivated (or disabled). As a result, 32-bits of data DQ0 through DQ31 may be received at the semiconductor memory device or may be provided to the external device. That is, when the first chip selection signal CS0 is at the logic 'low' state and the second chip selection signal CS1 is at the logic 'high' state, the semiconductor memory device shown in FIG. 1 may provide a 32-bit input/output architecture.

When the first chip selection signal CS0 is at the logic 'high' state and the second chip selection signal CS1 is at the logic 'low' state, the first unit memory chip 10 is deactivated (or disabled) and the second unit memory chip 20 is activated (or enabled). As a result, 32-bits of data DQ32 through DQ63 may be received at the semiconductor memory device or may be provided to the external device. That is, when the first chip selection signal CS0 is at the logic 'high' state and the second chip selection signal CS1 is at the logic 'low' state, the semiconductor memory device shown in FIG. 1 may provide a 32-bit input/output architecture.

When both of the chip selection signals CS0 and CS1 are at the logic 'high' state, both of the unit memory chips 10 and 20 are deactivated (or disabled), and data input/output operations are not performed.

The timing diagrams shown in FIGS. 2A and 2B illustrate relationships between the clock signal CLK, the first chip selection signal CS0, the second chip selection signal CS1, the input/output data DQ0 through DQ31, and the input/output data DQ32 through DQ63.

As shown in FIG. 2A, when an active command ACT is generated, a row address ADD0 is received, and when a write command WT is generated, a column address ADD1 is received. As shown in FIG. 2B, when the active command ACT is generated, the row address ADD0 is received, and when the write commands WT are generated, the column addresses ADD1 and ADD2 are received.

Referring to FIG. 2A, when the first chip selection signal CS0 and the second chip selection signal CS1 are simultaneously enabled, DATA1 is written to a memory cell(s) of the first unit memory chip 10 (corresponding to the row address ADD0 and the column address ADD1), and DATA2 is written to a memory cell(s) of the second unit memory chip 20 (corresponding to the row address ADD0 and the column address ADD1). That is, the first unit memory chip 10 and the second unit memory chip 20 may commonly use the same address information ADD0 and ADD1.

Referring to FIG. 2B, after the first chip selection signal CS0 is enabled, the second chip selection signal CS1 may be enabled. When the first chip selection signal CS0 is enabled, DATA1 is written to a memory cell(s) of the first unit memory chip 10 (corresponding to the row address ADD0 and the column address ADD1). When the second chip selection signal CS1 is enabled, DATA2 is written to a memory cell(s) of the second unit memory chip 20 (corresponding to the row address ADD0 and the column address ADD2).

As shown in FIG. 2A, the semiconductor memory device shown in FIG. 1 may write the DATA1 and DATA2 to memory cells of each of the first unit memory chip 10 and the second unit memory chip 20, corresponding to the same column address ADD1.

As shown in FIG. 2B, the semiconductor memory device shown in FIG. 1 may write the DATA1 and DATA2 to memory cells of each of the first unit memory chip 10 and the second unit memory chip 20 corresponding to the respective column address ADD1 and ADD2 which may be different.

Figure 3:
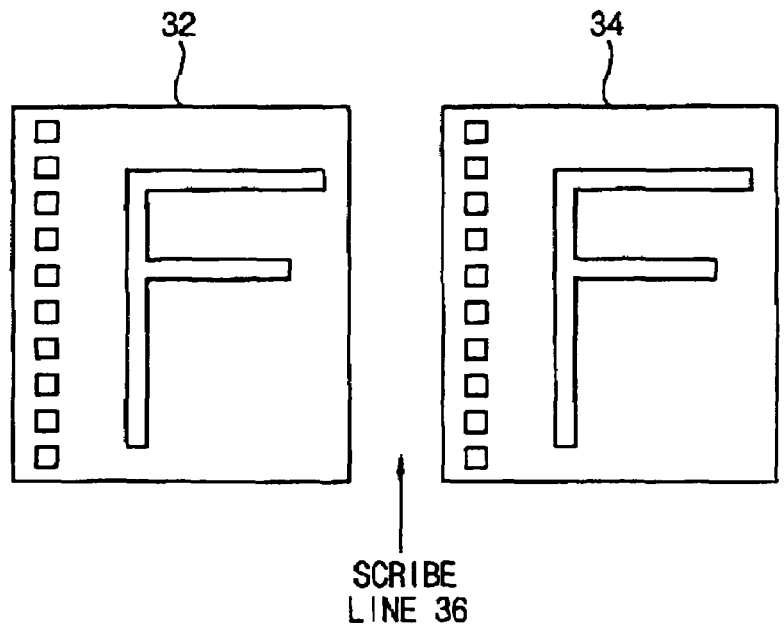
FIG. 3 is a block diagram illustrating a pair of unit chips configured in a shift arrangement.
Figure 4:
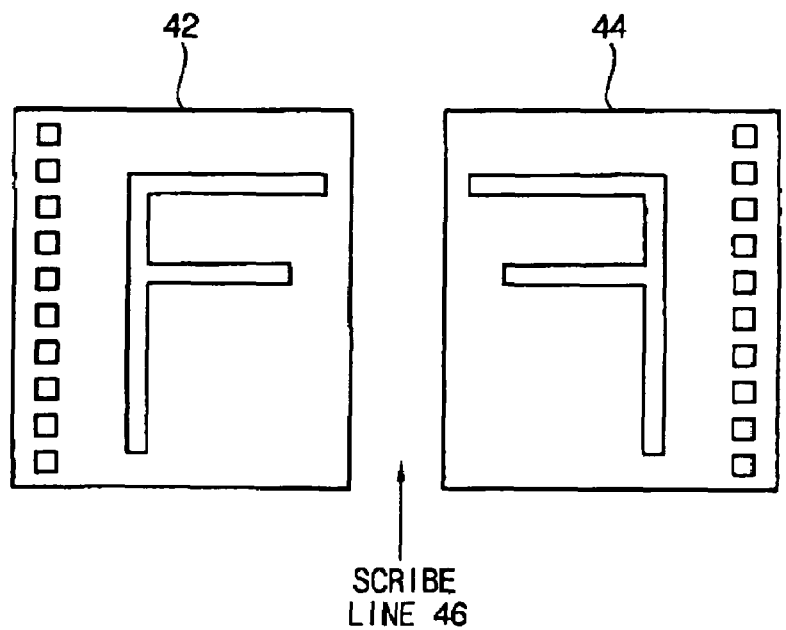
FIG. 4 is a block diagram illustrating a pair of unit chips configured in a mirror arrangement.

FIG. 3 is a diagram illustrating a pair of unit chips 32 and 34 configured in a shift arrangement, and FIG. 4 is a diagram illustrating a pair of unit chips 42 and 44 configured in a mirror arrangement. As shown in FIGS. 3 and 4, an interspace between two chips 32 and 34 represents a scribe line 36 such that the unit chips 32 and 34 are provided on a same semiconductor substrate. An interspace between two chips 42 and 44 represents a scribe line 46 such that the unit chips 42 and 44 are provided on a same semiconductor substrate. In the shift arrangement of FIG. 3, pads of the unit chips 32 and 34 may be provided in a same arrangement. In the mirrored arrangement of FIG. 4, pads of the unit chips 42 and 44 may be provided in a mirrored arrangement.

As shown in FIG. 3, when unit chips are arranged on a wafer (i.e. semiconductor substrate) in the shift arrangement, the unit chip 32 and the unit chip 34 have a layout identical to each other. As shown in FIG. 4, when unit chips are arranged on the wafer (i.e. semiconductor substrate) in the mirror arrangement, the unit chip 42 and the unit chip 44 are symmetric with respect to the scribe line 46.

Figure 5:
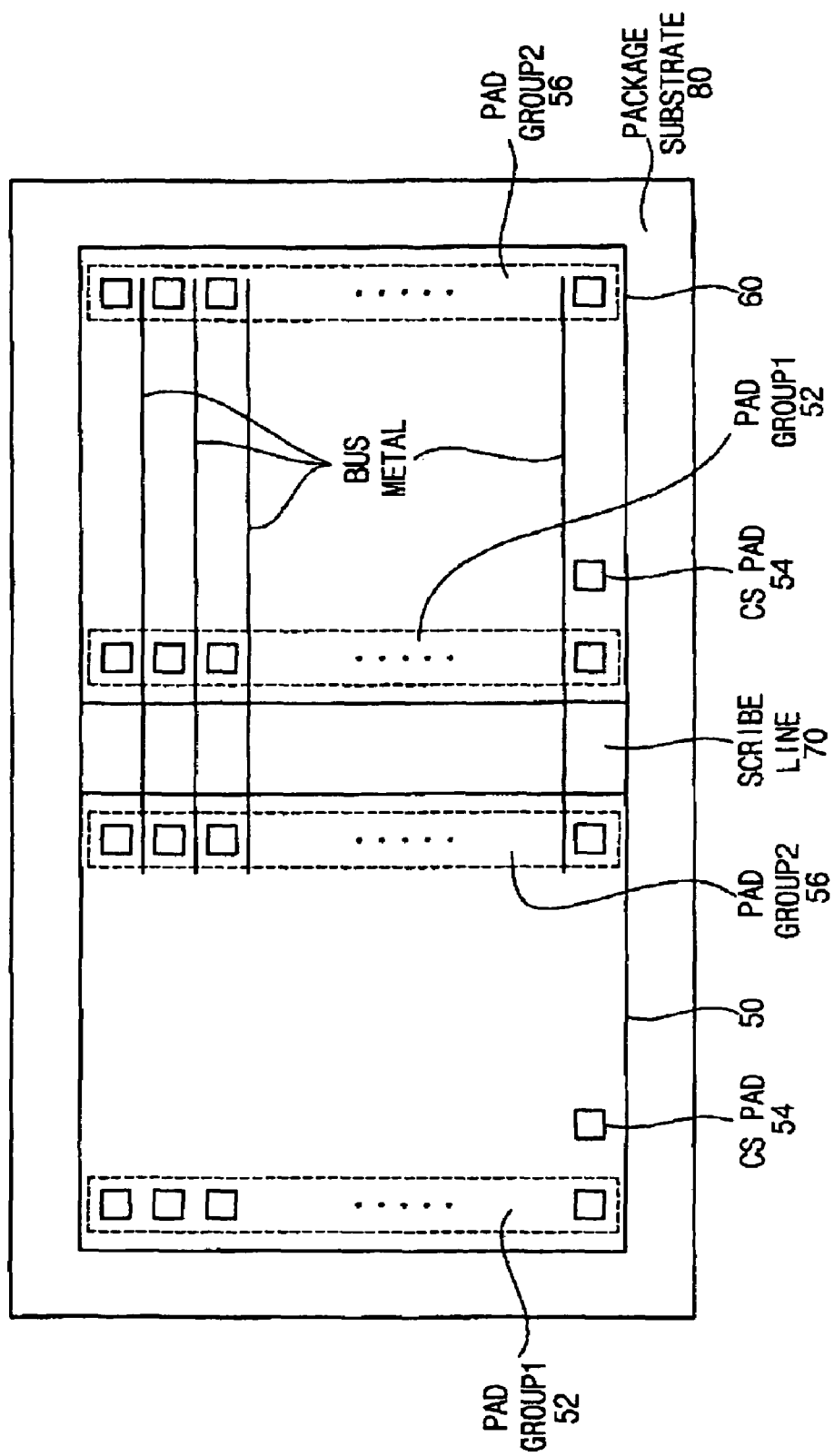
FIG. 5 is a plan view illustrating a chip layout of a semiconductor memory device shown in FIG. 1 according to embodiments of the present invention.

FIG. 5 is a plan view illustrating a chip layout of a semiconductor memory device shown in FIG. 1 according to embodiments of the present invention. The semiconductor memory device shown in FIG. 5 features the shift arrangement shown in FIG. 3. Referring to FIG. 5, the semiconductor memory device includes a first unit memory chip 50, a second unit memory chip 60 and a package substrate 80.

A scribe line 70 is provided between the first unit memory chip 50 and the second unit memory chip 60. The scribe line 70, the first unit memory chip 50 and the second unit memory chip 60 are formed as one body, and may be formed on one semiconductor substrate. Each of the first unit memory chip 50 and the second unit memory chip 60 may include a first pad group 52, a second pad group 56 and a chip selection pad 54. The first pad group 52 may include pads associated with data input/output, and the second pad group 56 may include pads to which the command signal CMD, the address signal ADDR and the clock signal CLK are provided.

A first chip selection signal CS0 is provided to the chip selection pad 54 of the first unit memory chip 50, and a second chip selection signal CS1 is provided to the chip selection pad 54 of the second unit memory chip 60.

A bus metal extends from a neighborhood of the second pad group 56 in the first unit memory chip 50 to a neighborhood of the second pad group 56 in the second unit memory chip 60. The pads of the second pad group 56 in the first unit memory chip 50 may be coupled to the respective pads of the second pad group 56 in the second unit memory chip 60 through the bus metal.

Figure 6:
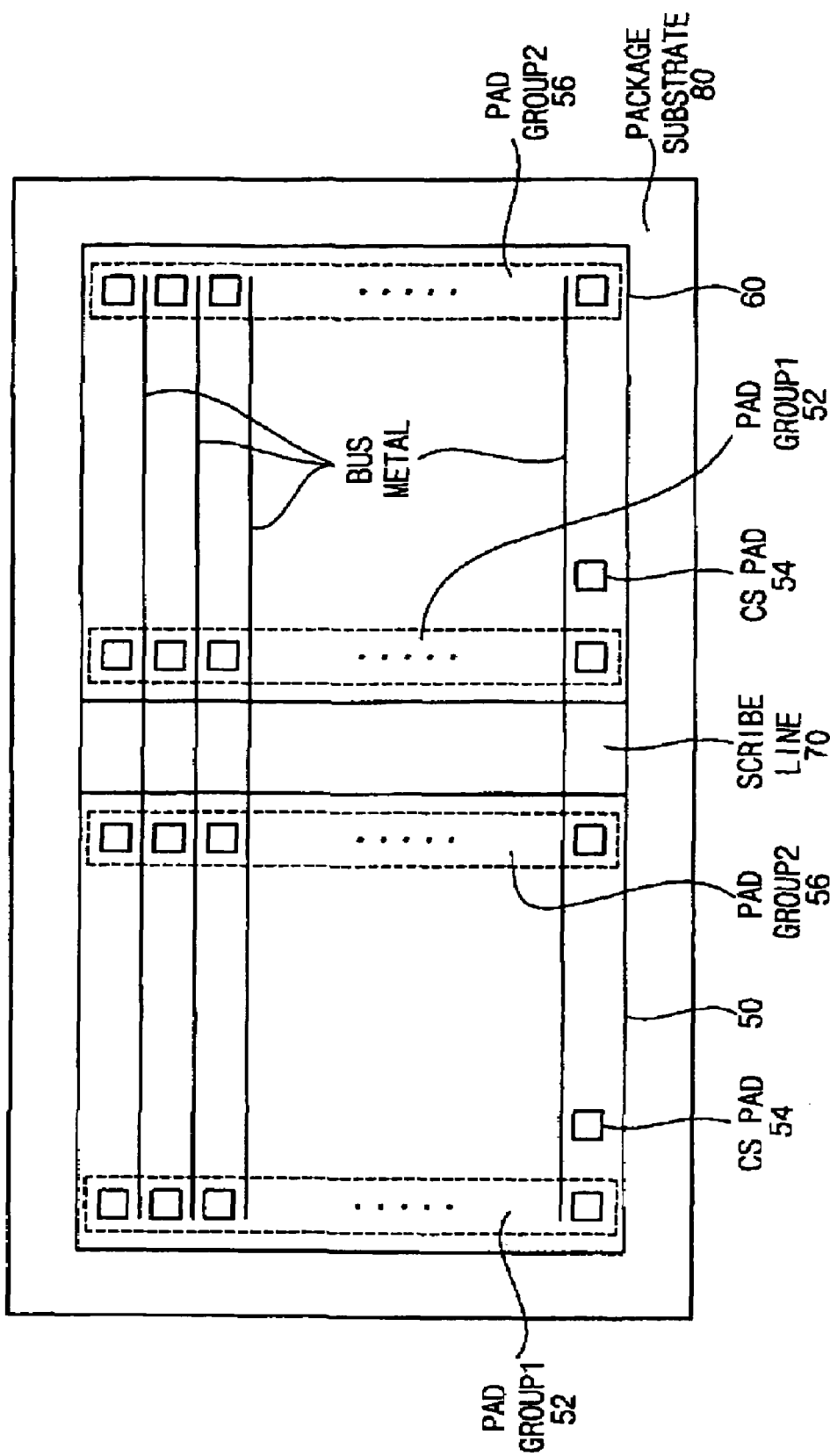
FIG. 6 is a plan view illustrating a chip layout of semiconductor memory devices shown in FIG. 1 according to other embodiments of the present invention.

FIG. 6 is a plan view illustrating a chip layout of the semiconductor memory device shown in FIG. 1 according other embodiments of the present invention. The chip layout shown in FIG. 6 is similar to that of the semiconductor memory device shown in FIG. 5 with a different layout of bus metal. Referring to FIG. 6, the bus metal may extend from a neighborhood of the first pad group 52 in the first unit memory chip 50 to a neighborhood of the second pad group 56 in the second unit memory chip 60 over a scribe line 70. Each of the pads of the second pad group 56 in the first unit memory chip 50 may be coupled to respective ones of the pads of the second pad group 56 in the second unit memory chip 60 through the bus metal.

Figure 7:
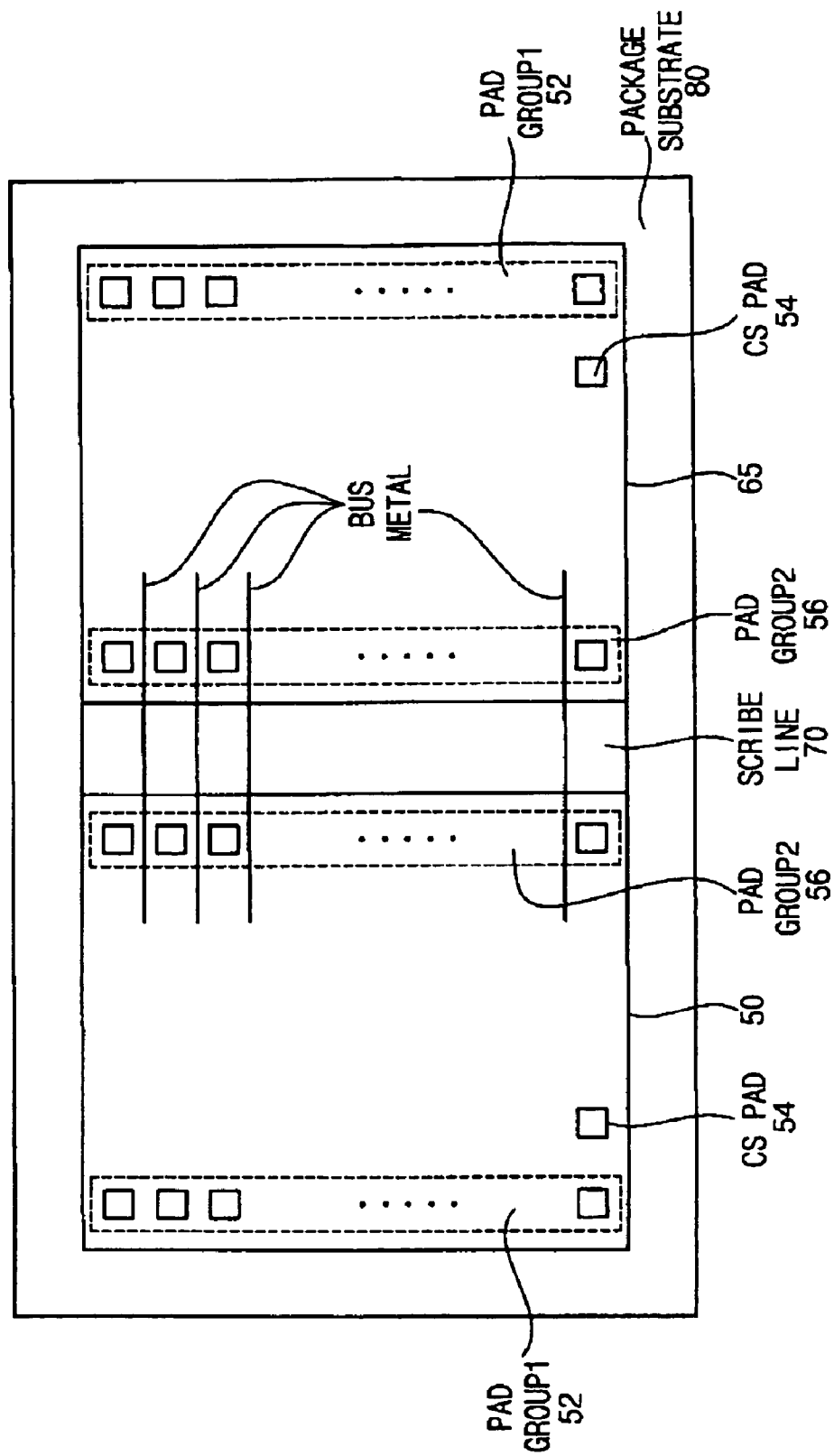
FIG. 7 is a plan view illustrating a chip layout of semiconductor memory devices shown in FIG. 1 according to still other embodiments of the present invention.

FIG. 7 is a plan view illustrating a chip layout of a semiconductor memory device shown in FIG. 1 according to still other embodiments of the present invention. The semiconductor memory device shown in FIG. 7 has the mirror arrangement shown in FIG. 4.

Referring to FIG. 7, the semiconductor memory device includes a first unit memory chip 50, a second unit memory chip 65 and a package substrate 80. A scribe line 70 is disposed between the first unit memory chip 50 and the second unit memory chip 65. The scribe line 70, the first unit memory chip 50 and the second unit memory chip 65 may be formed as one body, and may be formed on one semiconductor substrate. Each of the first unit memory chip 50 and the second unit memory chip 65 may include a first pad group 52, a second pad group 56 and a chip selection pad 54.

The first pad group 52 includes pads associated with data input/output, and the second pad group 56 includes pads to which the command signal CMD, the address signal ADDR and the clock signal CLK are provided. A first chip selection signal CS0 is provided to the chip selection pad 54 of the first unit memory chip 50, and a second chip selection signal CS1 is provided to the chip selection pad 54 of the second unit memory chip 65.

Because the layout of the semiconductor memory device shown in FIG. 7 has the mirror arrangement, the first unit memory chip 50 and the second unit memory chip 65 are symmetric with respect to the scribe line 70. A bus metal may extend from a neighborhood of the second pad group 56 of the first unit memory chip 50 to a neighborhood of the second pad group 56 of the second unit memory chip 65. Each of the pads of the second pad group 56 of the first unit memory chip 50 may be coupled to a respective pad of the second pad group 56 of the second unit memory chip 65 through the bus metal.

Figure 8:
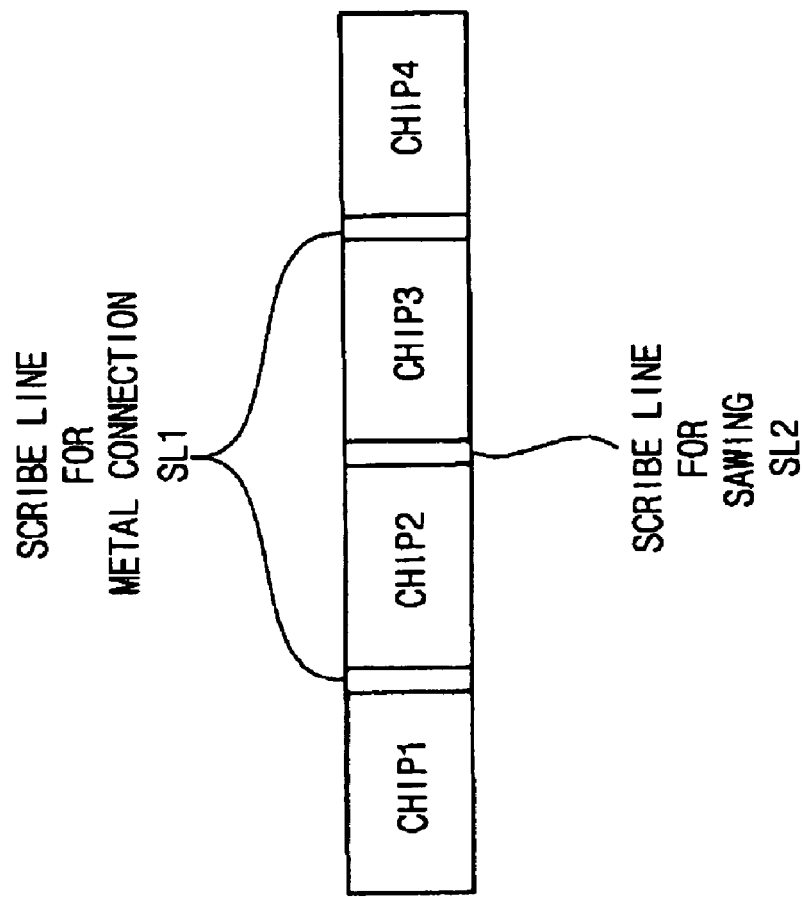
FIG. 8 is a cross sectional view illustrating a portion of a wafer on which a semiconductor memory device shown in FIG. 1 is implemented as semiconductor integrated circuit (IC) chips.

FIG. 8 is a cross sectional view illustrating a portion of a wafer or substrate on which the semiconductor memory device shown in FIG. 1 is implemented using a plurality of semiconductor integrated circuit (IC) chips. Referring to FIG. 8, a first unit chip and a second unit chip provide a first pair, and a third unit chip and a fourth unit chip provide a second pair. A scribe line SL1 disposed between the first unit chip and the second unit chip may provide a path of metal line(s) coupled between the first unit chip and the second unit chip, and the scribe line SL1 is not cut at a package step. The scribe line SL1 disposed between the third unit chip and the fourth unit chip may provide a path of metal line(s) coupled between the third unit chip and the fourth unit chip, and the scribe line SL1 is not cut at the package step. That is, when forming the first unit chip and the second unit chip as a single device, the scribe line SL1 is not cut. Similarly when forming the third unit chip and the fourth unit chip as a single device, the scribe line SL1 is not cut. A scribe line SL2 disposed between the second unit chip and the third unit chip may be cut at the package step, however, so that the second unit chip and the third unit chip are separated from each other. Stated in other words, the scribe lines SL1 may remain uncut after cutting the wafer and after packaging the device including chips CHP1 and CHP2 in a next level of packaging, such as on a leadframe, a printed circuit board, etc.

Figure 9:
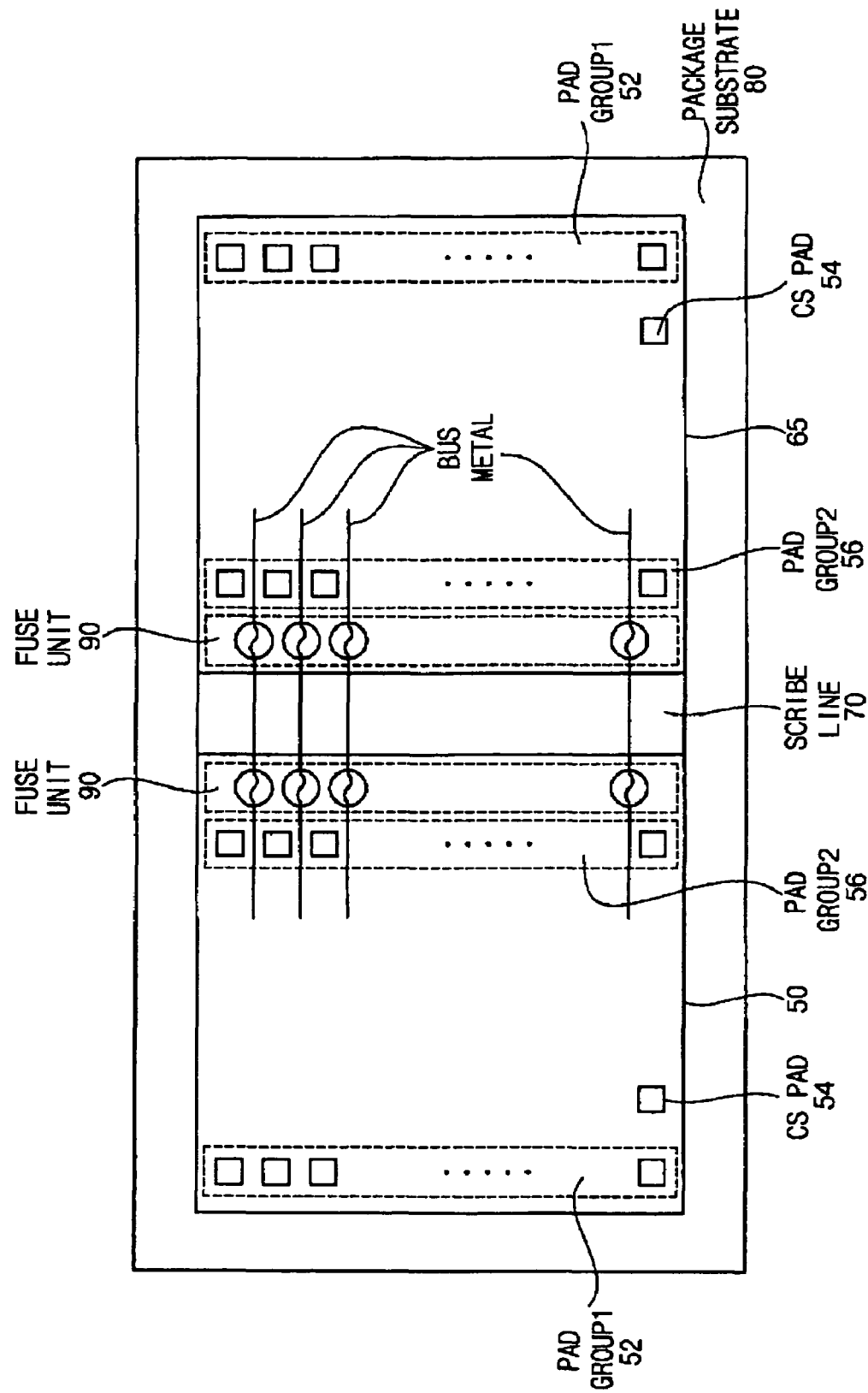
FIG. 9 is a plan view illustrating a chip layout of a semiconductor memory device shown in FIG. 1 according to still further still embodiments of the present invention.

FIG. 9 is a plan view illustrating a chip layout of a semiconductor memory device shown in FIG. 1 according to still other embodiments of the present invention. Both of the unit memory chips 50 and 65 may include a respective fuse unit 90. Referring to FIG. 9, the semiconductor memory device includes a first unit memory chip 50, a second unit memory chip 65 and a package substrate 80.

A scribe line 70 is disposed between the first unit memory chip 50 and the second unit memory chip 65. The scribe line 70, the first unit memory chip 50 and the second unit memory chip 65 are formed into one body, and are formed on one semiconductor substrate. Each of the first unit memory chip 50 and the second unit memory chip 65 includes a first pad group 52, a second pad group 56 and a chip selection pad 54.

The first pad group 52 may include pads associated with data input/output, and the second pad group 56 may include pads to which the command signal CMD, the address signal ADDR and the clock signal CLK are input. A first chip selection signal CS0 is input to the chip selection pad 54 of the first unit memory chip 50, and a second chip selection signal CS1 is input to the chip selection pad 54 of the second unit memory chip 65. Because the layout of the semiconductor memory device shown in FIG. 9 is provided in a mirror arrangement, the first unit memory chip 50 and the second unit memory chip 65 are symmetric with respect to the scribe line 70.

A bus metal may extend from a vicinity of the second pad group 56 in the first unit memory chip 50 to a vicinity of the second pad group 56 in the second unit memory chip 65. Each of the pads of the second pad group 56 of the first unit memory chip 50 may be coupled to a respective one of the pads of the second pad group 56 of the second unit memory chip 65 through a respective line of the bus metal.

In the layout of the semiconductor memory device shown in FIG. 9, each of the unit memory chips 50 and 65 includes a fuse unit 90 in addition to elements of the layout of the semiconductor memory device shown in FIG. 7. If the first unit memory chip 50 and the second unit memory chip 65 are used as individual unit memory chips by cutting the scribe line 70, the fuse unit 90 for each chip may be turned off.

When each of the first unit memory chip 50 and the second unit memory chip 65 are used as individual unit memory chips, the fuse unit 90 may be turned off to reduce occurrence of abnormal operations of the semiconductor memory device that may otherwise occur due to the metal line (arranged from the first unit memory chip 50 to the second unit memory chip 65) absorbing moisture.

Figure 10:
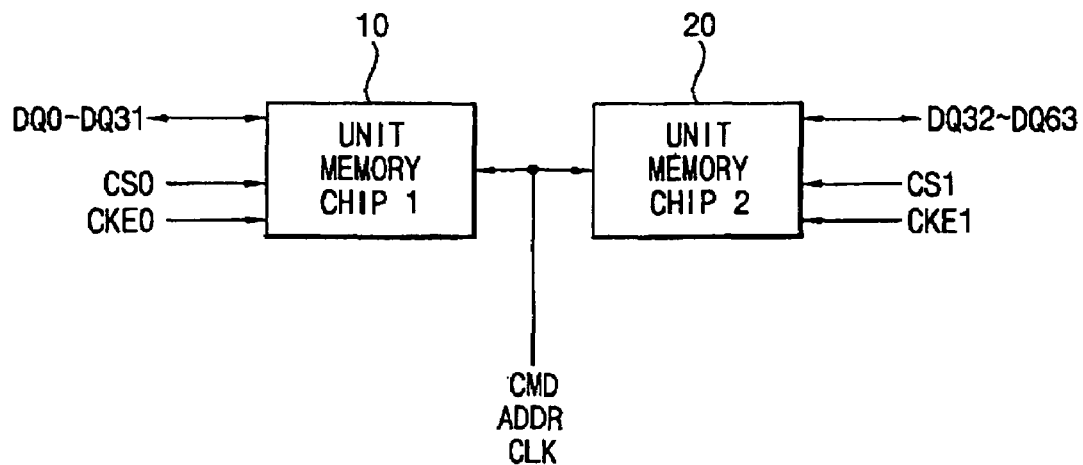
FIG. 10 is a block diagram illustrating a semiconductor memory device according to second embodiments of the present invention.

FIG. 10 is a block diagram illustrating semiconductor memory devices according to second embodiments of the present invention. Referring to FIG. 10, the semiconductor memory device includes a first unit memory chip 10 and a second unit memory chip 20.

The first unit memory chip 10 receives data DQ0 through DQ31 at the semiconductor memory device as data input and/or provides the data DQ0 through DQ31 to an external device as data output in response to a first chip selection signal CS0, a command signal CMD, an address signal ADDR and a clock signal CLK. The first unit memory chip 10 may be powered down in response to a first power down signal CKE0. The second unit memory chip 20 receives data DQ32 through DQ63 at the semiconductor memory device and/or provides the data DQ32 through DQ63 to an external device in response to a second chip selection signal CS1, the command signal CMD, the address signal ADDR and the clock signal CLK. The second unit memory chip 20 may be powered down in response to a second power down signal CKE1.

Figure 11:
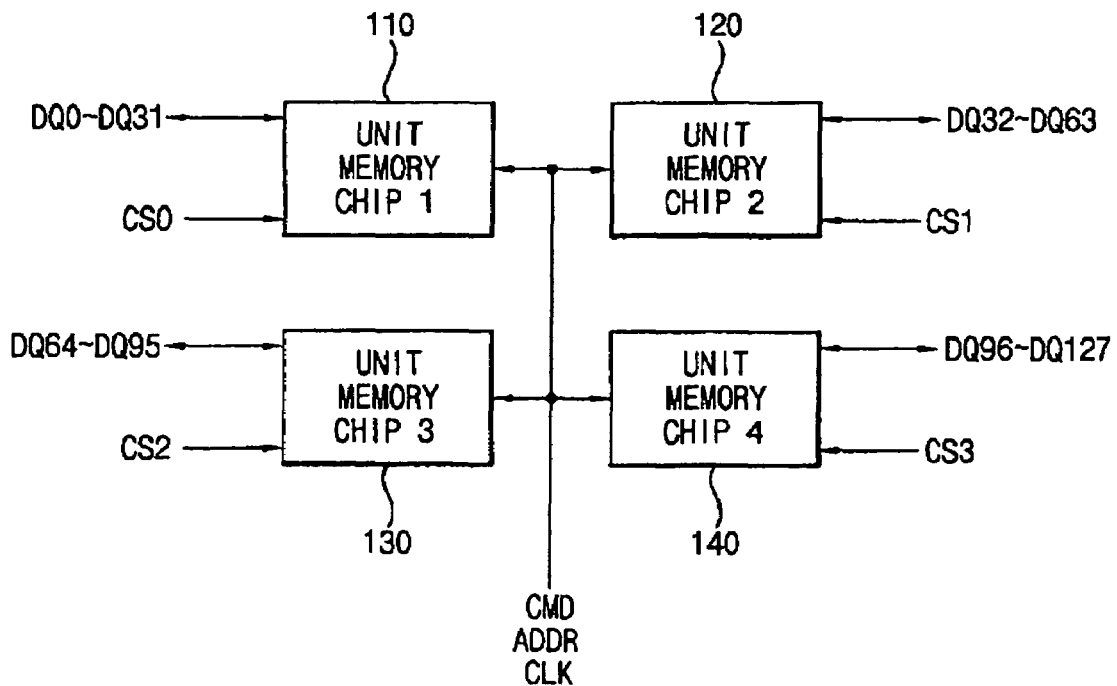
FIG. 11 is a block diagram illustrating a semiconductor memory device according to third embodiments of the present invention.

FIG. 11 is a block diagram illustrating a semiconductor memory device according to third embodiments of the present invention. The semiconductor memory device shown in FIG. 11 includes four unit memory chips having a 32-bit input/output architecture. Referring to FIG. 11, the semiconductor memory device includes a first unit memory chip 110, a second unit memory chip 120, a third unit memory chip 130 and a fourth unit memory chip 140. The first unit memory chip 110 receives data DQ0 through DQ31 at the semiconductor memory device as data input and/or provides the data DQ0 through DQ31 to an external device as data output in response to a first chip selection signal CS0, a command signal CMD, an address signal ADDR and a clock signal CLK. The second unit memory chip 120 receives data DQ32 through DQ63 at the semiconductor memory device as data input and/or provides the data DQ32 through DQ63 to an external device as data output in response to a second chip selection signal CS1, the command signal CMD, the address signal ADDR and the clock signal CLK. The third unit memory chip 130 receives data DQ64 through DQ95 at the semiconductor memory device as data input and/or provides the data DQ64 through DQ95 to an external device as data output in response to a third chip selection signal CS2, the command signal CMD, the address signal ADDR and the clock signal CLK. The fourth unit memory chip 140 receives data DQ96 through DQ127 at the semiconductor memory device as data input and/or provides the data DQ96 through DQ127 to an external device as data output in response to a fourth chip selection signal CS3, the command signal CMD, the address signal ADDR and the clock signal CLK.

Hereinafter, operations of the semiconductor memory device shown in FIG. 11 according to embodiments of the present invention will be explained with reference to FIG. 11.

The semiconductor memory device shown in FIG. 11 includes 4 unit memory chips 110 through 140 each having a 32-bit input/output architecture. As a result, the semiconductor memory device shown in FIG. 11 may provide a 128-bit input/output architecture.

The first, second, third, and fourth unit memory chips 110, 120, 130, and 140 may use the same command signal CMD, the same address signal ADDR and the same clock signal CLK, and input/output corresponding data through respective input/output pads (not shown). The semiconductor memory device shown in FIG. 11 may have an input/output architecture that varies based on logic states of the chip selection signals CS0, CS1, CS2 and CS3.

For example, when all of the chip selection signals CS0, CS1, CS2, and CS3 are at a logic 'low' state, all of the unit memory chips 110, 120, 130 and 140 are activated and 128-bits of data DQ0 through DQ127 may be received at the semiconductor memory device and/or provided to the external device. That is, when all of the chip selection signals CS0, CS1, CS2, and CS3 are at the logic 'low' state, the semiconductor memory device shown in FIG. 11 may provide a 128-bit input/output architecture.

When the first chip selection signal CS0 is at the logic 'low' state and the second, third and fourth chip selection signals CS1, CS2, and CS3 are at a logic 'high' state, the first unit memory chip 110 may be activated and the second, third and fourth unit memory chips 120, 130, and 140 may be deactivated. As a result, 32-bits of data DQ0 through DQ31 may be received at the semiconductor memory device and/or provided to an external device. That is, when the first chip selection signal CS0 is at the logic 'low' state and the second, third, and fourth chip selection signals CS1, CS2 and CS3 are at the logic 'high' state, the semiconductor memory device shown in FIG. 11 may provide a 32-bit input/output architecture.

When the first and second chip selection signals CS0 and CS1 are at the logic 'low' state, and the third and fourth chip selection signals CS2 and CS3 are at the logic 'high' state, the first and second unit memory chips 110 and 120 may be activated, and the third and fourth unit memory chips 130 and 140 may be deactivated. As a result, 64-bits of data DQ0 through DQ63 may be received at the semiconductor memory device and/or provided to an external device. That is, when the first and second chip selection signals CS0 and CS1 are at the logic 'low' state, and the third and fourth chip selection signals CS2 and CS3 are at the logic 'high' state, the semiconductor memory device shown in FIG. 11 may provide a 64-bit input/output architecture.

When the first, second, and third chip selection signals CS0, CS1, and CS2 are at the logic 'low' state and the fourth chip selection signal CS3 is at the logic 'high' state, the first, second, and third unit memory chips 110, 120, and 130 may be activated and the fourth unit memory chip 140 may be deactivated. As a result, 96 bits of data DQ0 through DQ95 may be received at the semiconductor memory device and/or provided to an external device. That is, when the first, second, and third chip selection signals CS0, CS1, and CS2 are at the logic 'low' state and the fourth chip selection signal CS3 is at the logic 'high' state, the semiconductor memory device shown in FIG. 11 may provide a 96-bit input/output architecture.

When only one of the unit memory chips among the four unit memory chips 110, 120, 130, or 140 is activated, the semiconductor memory device of FIG. 11 may provide a 32-bit input/output architecture. When only two of the unit memory chips among the four unit memory chips 110, 120, 130, or 140 are activated, the semiconductor memory device shown may provide a 64-bit input/output architecture. When only three of the unit memory chips among the four unit memory chips 110, 120, 130, or 140 are activated, the semiconductor memory device of FIG. 11 may provide a 96-bit input/output architecture. When all of the unit memory chips 110, 120, 130, and 140 are activated, the semiconductor memory device of FIG. 11 may provide a 128-bit input/output architecture. When all of the chip selection signals CS0, CS1, CS2, and CS3 are at the logic 'high' state, all of the unit memory chips 110 through 140 are deactivated and data input/output operations are not performed.

Figure 12:
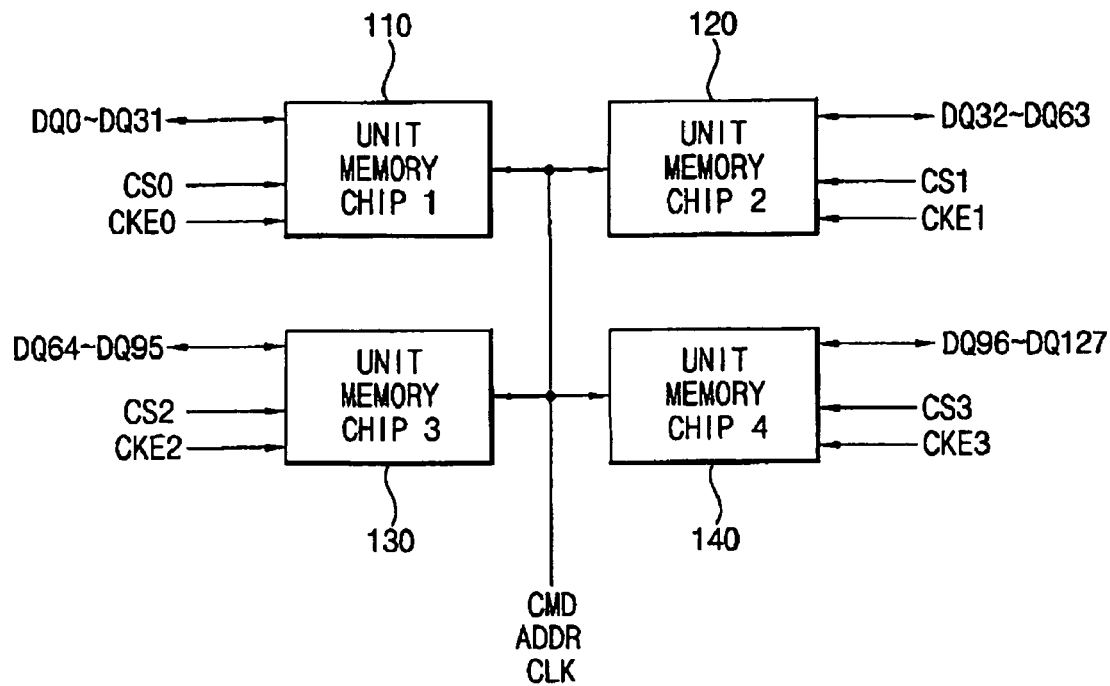
FIG. 12 is a block diagram illustrating a semiconductor memory device according to fourth embodiments of the present invention.

FIG. 12 is a block diagram illustrating semiconductor memory devices according to fourth embodiments of the present invention.

The semiconductor memory device shown in FIG. 12 is similar to that shown in FIG. 11. In FIG. 12, however, power down signals are applied to each of the unit memory chips 110, 120, 130 and 140. For example, when first, second, third, and fourth power down signals CKE0, CKE1, CKE2, and CKE3 are at the logic 'low' state, power is provided to all of the unit memory chips 110, 120, 130, and 140.

When the first, second, and third power down signals CKE0, CKE1, and CKE2 are at the logic 'low' state and the fourth power down signal CKE3 is at the logic 'high' state, power is provided to the first, second, and third unit memory chips 110, 120, and 130 and power is not provided to the fourth unit memory chip 140. When the first and second power down signals CKE0 and CKE1 are at the logic 'low' state, and the third and fourth power down signals CKE2 and CKE3 are at the logic 'high' state, power is provided to both of the first and second unit memory chips 110 and 120, and the power is not provided to either of the third or fourth unit memory chips 130 or 140.

When the first power down signal CKE0 is at the logic 'low' state and the second, third, and fourth power down signals CKE1, CKE2, and CKE3 are at the logic 'high' state, power is provided to the first unit memory chip 110 and power is not provided to the second, third, or fourth unit memory chips 120, 130, or 140.

Semiconductor memory devices including 4 unit memory chips as shown in FIGS. 11 and 12 may also have the unit memory chips using the chip layout of the semiconductor memory device having 2 unit memory chips as shown in FIGS. 3 through 10.

Hereinafter, a chip layout of a semiconductor memory device including 4 unit memory chips will be described with reference to FIG. 12. A scribe line disposed between the first and second unit memory chips 110 and 120, a scribe line disposed between the third and fourth unit memory chips 130 and 140, a scribe line disposed between the first and third unit memory chips 110 and 130, and a scribe line disposed between the second and fourth unit memory chips 120 and 140 may remain unsliced after packaging.

Bonding pads (not shown) in the first unit memory chip 110, for the command signal CMD, the address signal ADDR and the clock signal CLK, may be coupled to corresponding bonding pads (not shown) in the second unit memory chip 120, for the command signal CMD, the address signal ADDR and the clock signal CLK, through a first metal line(s) (not shown) formed using a semiconductor manufacturing process before slicing/cutting the wafer.

Bonding pads (not shown) in the third unit memory chip 130, for the command signal CMD, the address signal ADDR and the clock signal CLK, may be coupled to corresponding bonding pads (not shown) in the fourth unit memory chip 140, for the command signal CMD, the address signal ADDR and the clock signal CLK, through a first metal line(s) (not shown) formed using a semiconductor manufacturing process before slicing/cutting the wafer.

Bonding pads (not shown) in the first unit memory chip 110, for the command signal CMD, the address signal ADDR and the clock signal CLK, may be coupled to corresponding bonding pads, (not shown) in the third unit memory chip 130, for the command signal CMD, the address signal ADDR and the clock signal CLK, through a second metal line(s) (not shown) formed using a semiconductor manufacturing process before slicing/cutting the wafer.

Bonding pads (not shown) in the second unit memory chip 120, for the command signal CMD, the address signal ADDR and the clock signal CLK, may be coupled to corresponding bonding pads (not shown) in the fourth unit memory chip 140, for the command signal CMD, the address signal ADDR and the clock signal CLK, through the second metal line(s) (not shown) formed using a semiconductor manufacturing process before cutting/slicing the wafer.

Figure 13:
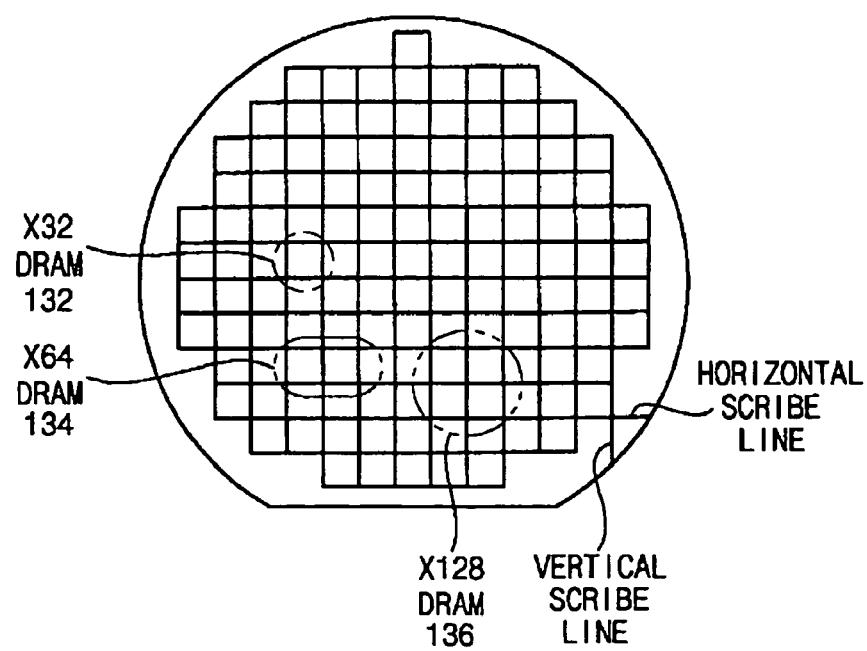
FIG. 13 is a plan view illustrating a semiconductor wafer on which a semiconductor memory device according to embodiments of the present invention is implemented as semiconductor integrated circuit (IC) chips.

FIG. 13 is a plan view illustrating a semiconductor wafer on which semiconductor memory devices according to embodiments of the present invention may be implemented as semiconductor integrated circuit (IC) chips.

Referring to FIG. 13, a unit memory chip 132 is formed between two horizontal scribe lines and between two vertical scribe lines. The unit memory chip 132 may be an X32 DRAM having a 32-bit architecture. An X64 DRAM 134 having a 64-bit architecture may include two unit memory chips, and an X128 DRAM 136 having a 128-bit architecture may include four unit memory chips.

As described above, a semiconductor memory device according to embodiments of the present invention may control its input/output architecture by selecting from a plurality of unit memory chips formed and maintained on a same semiconductor substrate in response to the chip selection signals.

In addition, a semiconductor memory device according to embodiments of the present invention may be fabricated as a multi-chip package (MCP) with a metal line(s) formed using a semiconductor manufacturing process to pass across the scribe line on a semiconductor wafer to couple the pads formed in the unit memory chips to each other.

While embodiments of the present invention and their advantages have been described in detail, it should be understood that various changes, substitutions and alterations may be made herein without departing from the scope of the invention.

What is claimed is:

1. A semiconductor memory device comprising:
  a semiconductor substrate;
  a first unit memory device on the semiconductor substrate, wherein the first unit memory device is configured to receive first through $N^{th}$ data bits and/or to provide first through $N^{th}$ data bits to an external device in response to a command signal, an address signal, and a clock signal, and in response to a first chip selection signal; and
  a second unit memory device on the semiconductor substrate wherein the second unit memory device is configured to receive $(N+1)^{th}$ through $2N^{th}$ data bits and/or to provide $(N+1)^{th}$ through $2N^{th}$ data bits to an external device in response to the command signal, the address signal, and the clock signal, and in response to a second chip selection signal;
  wherein the first unit memory device and the second unit memory device are separated by an uncut scribe line and wherein other scribe lines adjacent the first unit memory device and the second unit memory device are cut.

2. The semiconductor memory device according to claim 1, wherein each of the first unit memory device and the second unit memory device has a same configuration.

3. The semiconductor memory device according to claim 1, wherein the semiconductor memory device provides a 2N-bit architecture when both of the first chip selection signal and the second chip selection signal are enabled, and wherein the semiconductor memory device provides a N-bit architecture when only one of the first chip selection signal and the second chip selection signal is enabled.

4. The semiconductor memory device according to claim 1, wherein the first unit memory device includes a first command signal pad, a first address signal pad, and a first clock signal pad respectively configured to receive the command signal, the address signal, and the clock signal, and wherein the second unit memory device includes a second command signal pad, a second address signal pad, and a second clock signal pad respectively configured to receive the command signal, the address signal, and the clock signal.

5. The semiconductor memory device according to claim 4, further comprising:
a command signal line electrically coupling the first command signal pad and the second command signal pad;
an address signal line electrically coupling the first address signal pad and the second address signal pad; and
a clock signal line electrically coupling the first clock signal pad and the second clock signal pad.

6. The semiconductor memory device according to claim 5, wherein each of the command signal line, the address signal line, and the clock signal line comprises a respective metal line including a fuse circuit.

7. The semiconductor memory device according to claim 5, wherein a linear border separates the first unit memory device and the second unit memory device on the semiconductor substrate and wherein each of the command, address, and clock signal lines extends across the border between the first unit memory device and the second unit memory device.

8. The semiconductor memory device according to claim 1, wherein a linear border separates the first unit memory device and the second unit memory device on the semiconductor substrate and wherein the first unit memory device and the second unit memory device have a mirrored symmetry with respect to the linear border.

9. The semiconductor memory device according to claim 1, wherein a linear border separates the first unit memory device and the second unit memory device on the semiconductor substrate and wherein the first unit memory device and the second unit memory device have a shifted symmetry with respect to the linear border.

10. The semiconductor memory device according to claim 1, wherein the first unit memory device is configured to receive a first power down signal and to power down responsive to the first power down signal, and wherein the second unit memory device is configured to receive a second power down signal and to power down responsive to the second power down signal.

11. The semiconductor memory device according to claim 1, wherein N is equal to 32.

12. The semiconductor memory device according to claim 1, further comprising:
a third unit memory device on the semiconductor substrate, wherein the third unit memory device is configured to receive $(2N+1)^{th}$ through $3N^{th}$ data bits and/or to provide $(2N+1)^{th}$ through $3N^{th}$ data bits to an external device in response to the command signal, the address signal, and the clock signal, and in response to a third chip selection signal; and
a fourth unit memory device on the semiconductor substrate wherein the fourth unit memory device is configured to receive $(3N+1)^{th}$ through $4N^{th}$ data bits and/or to provide $(3N+1)^{th}$ through $4N^{th}$ data bits to an external device in response to the command signal, the address signal, and the clock signal, and in response to a fourth chip selection signal.

13. The semiconductor memory device according to claim 12, wherein each of the first, second, third, and fourth unit memory devices has a same configuration.

14. The semiconductor memory device according to claim 12, wherein the semiconductor memory device provides a 4N-bit architecture when all of the first, second, third, and fourth chip selection signals are enabled, wherein the semiconductor memory device provides a 3N-bit architecture when only three of the first, second, third, and fourth chip selection signals are enabled, wherein the semiconductor memory device provides a 2N-bit architecture when only two of the first, second, third, and fourth chip selection signals are enabled, and wherein the semiconductor memory device provides an N-bit architecture when only one of the first, second, third, and fourth chip selection signals is enabled.

15. A semiconductor in memory device comprising:
a semiconductor substrate;
a first unit memory device on the semiconductor substrate, wherein the first unit memory device is configured to receive first through $N^{th}$ data bits and/or to provide first through $N^{th}$ data bits to an external device in response to a command signal, an address signal, and a clock signal, and in response to a first chip selection signal;
a second unit memory device on the semiconductor substrate wherein the second unit memory device is configured to receive $(N+1)^{th}$ through $2N^{th}$ data bits and/or to provide $(N+1)^{th}$ through $2N^{th}$ data bits to an external device in response to the command signal, the address signal, and the clock signal, and in response to a second chip selection signal;
a third unit memory device on the semiconductor substrate, wherein the third unit memory device is configured to receive $(2N+1)^{th}$ through $3N^{th}$ data bits and/or to provide $(2N+1)^{th}$ through $3N^{th}$ data bits to an external device in response to the command signal, the address signal, and the clock signal, and in response to a third chip selection signal; and
a fourth unit memory device on the semiconductor substrate wherein the fourth unit memory device is configured to receive $(3N+1)^{th}$ through $4N^{th}$ data bits and/or to provide $(3N+1)^{th}$ through $4N^{th}$ data hits to an external device in response to the command signal, the address signal, and the clock signal, and in response to a fourth chip selection signal;
wherein the first unit memory device and the second unit memory device are separated by an uncut scribe line, wherein the third unit memory device and the fourth unit memory device are separated by an uncut scribe line, wherein the first unit memory device and the third unit memory device are separated by an uncut scribe line, wherein the second unit memory device and the fourth unit memory device are separated by an uncut scribe line, and wherein other scribe lines adjacent the first, second, third, and fourth unit memory devices are cut.

16. The semiconductor memory device according to claim 12, wherein the first unit memory device includes a first command signal pad, a first address signal pad, and a first clock signal pad respectively configured to receive the command signal, the address signal, and the clock signal and wherein the second unit memory device includes a second command signal pad, a second address signal pad, and a second clock signal pad respectively configured to receive the command signal, the address signal, and the clock signal.

17. The semiconductor memory device according to claim 16, wherein the third unit memory device includes a third command signal pad, a third address signal pad, and a third clock signal pad respectively configured to receive the command signal, the address signal, and the clock signal and wherein the fourth unit memory device includes a fourth command signal pad, a fourth address signal pad, and a fourth clock signal pad respectively configured to receive the command signal, the address signal, and the clock signal.

18. The semiconductor memory device according to claim 17, further comprising:
a command signal line electrically coupling the first, second, third, and fourth command signal pads;

an address signal line electrically coupling the first, second, third, and fourth address signal pads; and
a clock signal line electrically coupling the first, second, third, and fourth clock signal pads.

19. A semiconductor memory device comprising:
a semiconductor substrate;
a first unit memory device on the semiconductor substrate, wherein the first unit memory device is configured to receive first through $N^{th}$ data bits and/or to provide first through $N^{th}$ data bits to an external device in response to a command signal, an address signal, and a clock signal, and in response to a first chip selection signal;
a second unit memory device on the semiconductor substrate wherein the second unit memory device is configured to receive $(N+1)^{th}$ through $2N^{th}$ data bits and/or to provide $(N+1)^{th}$ through $2N^{th}$ data bits to an external device in response to the command signal, the address signal, and the clock signal, and in response to a second chip selection signal;
a third unit memory device on the semiconductor substrate, wherein the third unit memory device is configured to receive $(2N+1)^{th}$ through $3N^{th}$ data bits and/or to provide $(2N+1)^{th}$ through $3N^{th}$ data bits to an external device in response to the command signal, the address signal, and the clock signal, and in response to a third chip selection signal; and
a fourth unit memory device on the semiconductor substrate wherein the fourth unit memory device is configured to receive $(3N+1)^{th}$ through $4N^{th}$ data bits and/or to provide $(3N+1)^{th}$ through $4N^{th}$ data bits to an external device in response to the command signal, the address signal, and the clock signal, and in response to a fourth chip selection signal;
wherein the first unit memory device is configured to receive a first power down signal and to power down responsive to the first power down signal, wherein the second unit memory device is configured to receive a second power down signal and to power down responsive to the second power down signal, wherein the third unit memory device is configured to receive a third power down signal and to power down responsive to the third power down signal, and wherein the fourth unit memory device is configured to receive a fourth power down signal and to power down responsive to the fourth power down signal.

20. The semiconductor memory device according to claim 12, wherein N is equal to 32.

21. The semiconductor memory device according to claim 1, wherein the semiconductor substrate comprises a continuous semiconductor substrate extending between the first and second unit memory devices.

22. The semiconductor memory device according to claim 1, wherein the first and second chip selection signals comprise different chip selection signals.

* * * * *